(12) United States Patent
Bicakci

(10) Patent No.: US 7,397,295 B2
(45) Date of Patent: Jul. 8, 2008

(54) ACTIVE CURRENT CANCELLATION FOR HIGH PERFORMANCE VIDEO CLAMPS

(75) Inventor: Ara Bicakci, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 213 days.

(21) Appl. No.: 11/345,929

(22) Filed: Feb. 2, 2006

(65) Prior Publication Data
US 2007/0176645 A1    Aug. 2, 2007

(51) Int. Cl.
*H03L 5/00*    (2006.01)
(52) U.S. Cl. .................. 327/307; 327/317; 327/53
(58) Field of Classification Search ......... 327/306–309, 327/317, 319, 53, 362
See application file for complete search history.

(56) References Cited

U.S. PATENT DOCUMENTS 6,339,355 B1 *   1/2002   Yamauchi et al. ........... 327/307
6,973,182 B1 *  12/2005   Aude ..................... 379/399.01

* cited by examiner

*Primary Examiner*—Dinh T. Le
(74) *Attorney, Agent, or Firm*—Christopher P. Maioran PC

(57) ABSTRACT

An apparatus comprising a first circuit, a second circuit and a third circuit. The first circuit may be configured to generate a video input signal having a voltage. The second circuit may have a finite input resistance configured to generate a current in response to presenting the voltage across the finite input resistance. The third circuit may be configured to cancel the current by (i) generating the current in response to presenting the voltage across a replica resistor having a resistance similar to the finite input resistance and (ii) passing the current away from the apparatus.

20 Claims, 4 Drawing Sheets

ACTIVE CURRENT CANCELLATION FOR HIGH PERFORMANCE VIDEO CLAMPS

FIELD OF THE INVENTION

The present invention relates to video processing generally and, more particularly, to a method and/or apparatus for implementing an active current cancellation for high performance video clamps.

BACKGROUND OF THE INVENTION

To save power and ensure compatibility among devices built by different manufacturers, analog video signals are AC coupled. AC coupling implies that signal levels are not known by a video receiver, or change in time due to the ever changing content of the video signal. In applications where an analog video source is digitized, or several analog video signals are mixed, a need arises for the restoration and tracking of the DC level of the incoming video signal by the video receiver. In practice, the restoration and tracking of the DC level is accomplished by restoring the DC level of a certain content independent portion of the video signal to a known value via the use of a clamp circuit.

The ideal clamp circuit restores the desired value with a minimum error. Clamp noise (i.e., the line-to-line variation or offset in the level of the video signal) generates artifacts which tend to annoy the human eye when viewed. Equally important is the linearity of the circuitry (i.e., gain/programmable gain amplifier (PGA) etc.) which processes the incoming analog video signal prior to mixing or digitizing. Circuit topologies which lend themselves to the most linear signal processing with the least power consumption tend to make the design of a quiet clamp circuit difficult.

Conventional clamp circuits implement a high input impedance on a video receiver. Such a condition arises because a low input impedance combined with AC coupling capacitance creates a high pass filter. The high pass filter includes a high enough cutoff frequency to cause a drift of the voltage levels on the video receiver as the video content changes. The current drawn by the finite input impedance causes the DC level of the video signal to drift towards the voltage where the input impedance is terminated. Such a condition provides a line-to-line variation in the overall video signal as seen by the video receiver. To prevent drift in the video signal, the current from the clamp circuitry is increased to compensate for the current drawn by the finite impedance. The increased current temporarily restores the video signal to the appropriate level but cannot prevent the line-to-line fluctuation.

Maintaining a very high input impedance is difficult in designing a high bandwidth and linear circuit with low power consumption. In one example, a topology may include a video receiver with an operational amplifier implemented as a programmable gain amplifier and a clamping circuit. The operational amplifier of a PGA is configured as a non-inverting operational amplifier. The input of the operational amplifier presents a high impedance. Linearity is difficult to achieve, especially using low power supplies and large input levels since an input node between the operational amplifier and the clamping circuit tries to track the incoming signal. A designer may have to use complicated rail-to-rail input operational amplifier and/or consume a lot of current to get the performance needed for high linearity and bandwidth applications such as high definition television (HDTV). Another approach may involve implementing the operational amplifier in an inverting configuration. In principle, such a topology may yield very linear and low power designs at lower supply voltages since both inputs of the operational amplifier are held at some reference voltage (i.e., VOP) and move very little. However, with an inverting configuration, the effective input impedance of the video receiver is the resistance connected to the input of the operational amplifier. The impact of the input resistor is minimized by selecting a very large value. The selection of the input resistor with a large resistance value implies that to get any gain out of the operational amplifier in an inverting configuration, a feedback resistor has to be very large. Implementing a feedback resistor with a high resistance value combined with any parasitic capacitance at the input of the operational amplifier reduces the bandwidth and makes it difficult to design a linear gain stage.

It would be desirable to implement a method and/or apparatus to allow the simultaneous design of a quiet clamp and very linear analog front end for a video receiver.

SUMMARY OF THE INVENTION

The present invention concerns an apparatus comprising a first circuit, a second circuit and a third circuit. The first circuit may be configured to generate a video input signal having a voltage. The second circuit may have a finite input resistance configured to generate a current in response to presenting the voltage across the finite input resistance. The third circuit may be configured to cancel the current by (i) generating the current in response to presenting the voltage across a replica resistor having a resistance similar to the finite input resistance and (ii) passing the current away from the apparatus.

The objects, features and advantages of the present invention include providing a method and/or apparatus for active current cancellation for high performance video clamps that may (i) allow for the simultaneous design of a quiet clamp along with a linear front end, (ii) be inexpensive to implement and/or (iii) be easily implemented.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
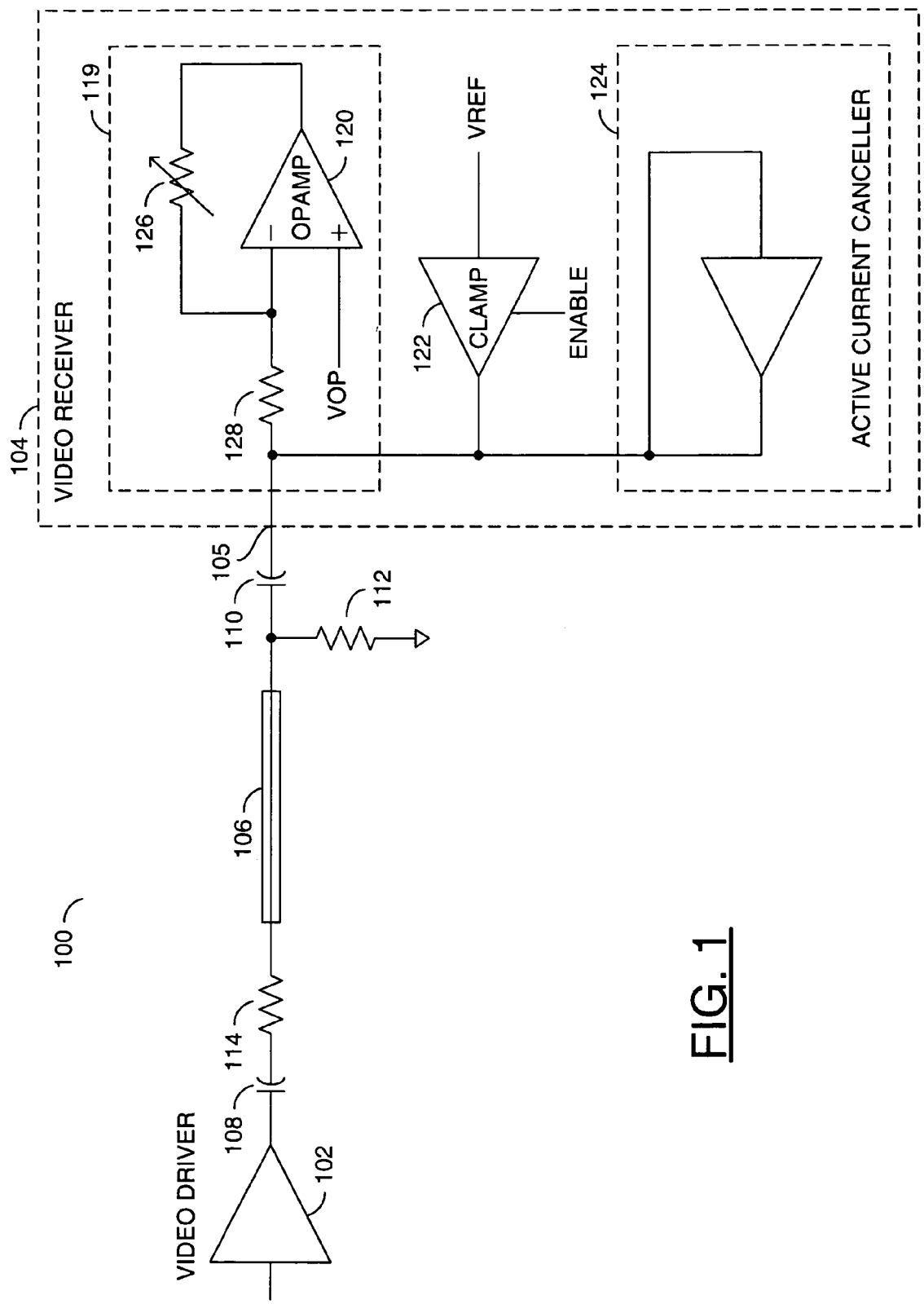
FIG. 1 is a diagram of an embodiment of the present invention.

Referring to FIG. 1, a diagram of a system 100 is shown in accordance with a preferred embodiment of the present invention. The system 100 generally comprises a video driver 102 and a video receiver 104. The video driver 102 is generally connected to the video receiver 104 through a transmission line 106. A filter capacitor 108 and a filter capacitor 110 may also be connected between the video driver 102 and the video receiver 104. A resistor 112 may provide a path to ground between the transmission line 106 and the video receiver 104. A resistor 114 may be connected between the video driver 102 and the transmission line 106. The resistor 112 and the resistor 114 may, in one example, have a resistance of approximately 75 ohms. However, other resistances, such as 50 ohms (or less) may be implemented to meet the design criteria of a particular implementation. The capacitor 108 may, in one example, have a value of 1 microfarad. However, other values, such as 0.5 microfarads (or less) to 1.5 microfarads (or more) may be implemented to meet the design criteria of a particular implementation. The capacitor 110 may have a value of 1 nanofarad. However, other values, such as 0.5 nanofarads (or less) to 1.5 nanofarads (or more) may be implemented to meet the design criteria of a particular implementation.

The video receiver 104 generally comprises a block (or circuit) 119, a block (or circuit) 122 and a block (or circuit) 124. The circuit 119 may be implemented as an inverting circuit. The circuit 122 may be implemented as a clamp circuit. The circuit 124 may be implemented as a current cancellation circuit. The video receiver 104 may receive a video signal at an input 105. The inverting circuit 119 generally comprises a resistor 126, a resistor 128 and an operational amplifier 120. The resistor 126 may be implemented as a variable resistor. The variable resistor 126 may be connected between an output of the operational amplifier 120 and a negative terminal of the operational amplifier 120. The resistor 128 may be coupled between the negative input of the operational amplifier 120 and the capacitor 110. The inverting circuit 119 may be implemented in an inverting operational amplifier topology. The clamp circuit 122 may have an input that receives a signal (e.g., VREF) and an enable input that may receive a signal (e.g., ENABLE).

The system 100 may implement the inverting operational amplifier topology at the input 105 of the video processing chain (or the video receiver 104) to take advantage of the high linearity and/or high bandwidth properties associated with the inverted operational amplifier circuit 119. The clamp circuit 122 and the current cancellation circuit 124 may actively cancel the current generated from the finite input impedance resistor 128. The clamp circuit 122 and the current cancellation circuit 124 may ensure that the average current drawn by the video receiver 104 is zero or low enough to the extent that the current drawn by the resistor 128 may be successfully canceled. The effective input impedance of the video receiver 104 may be largely increased from the actual physical resistance (or the physical resistance of the resistor 128) that is implemented.

Figure 2:
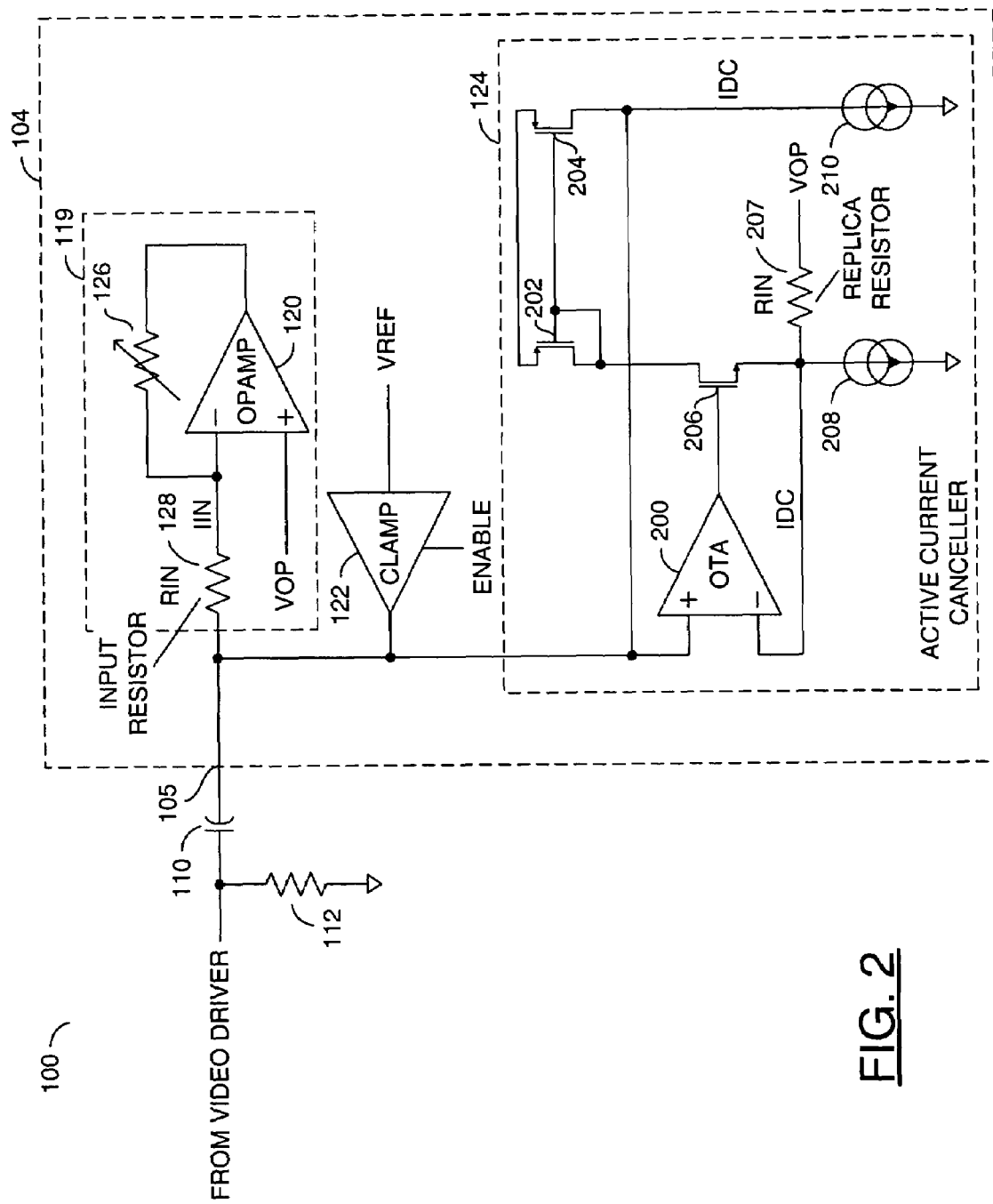
FIG. 2 is a detailed diagram of the present invention.

Referring to FIG. 2, a more detailed circuit of the system 100 is shown. The video receiver 104 generally comprises the inverting circuit 119, the clamp circuit 122 and the current cancellation circuit 124. The current cancellation circuit 124 generally comprises an operational amplifier 200, a transistor 202, a transistor 204, a transistor 206, a resistor 207, a current source 208, and current source 210. In one example, the operational amplifier 200 may be implemented as an operational transconductance amplifier (OTA). However, a traditional operational amplifier or an OTA may be implemented. An OTA may not have as low of an output impedance as a traditional operational amplifier. The resistor 207 may be implemented as a replica (or duplicate) resistor of the input resistor 128 in the inverting circuit 119. The transistors 202, 204 and 206 may be implemented as CMOS transistors. The transistors 202 and 204 are shown implemented as P-type transistors. The transistor 206 is shown implemented as an N-type transistor. However, other transistor types may be implemented to meet the design criteria of a particular implementation. The current sources 208 and 210 may be implemented as DC current sources.

A video signal from the input 105 of the video receiver 104 may be sensed by a positive terminal of the operational amplifier 200. The positive input of the operational amplifier 200 may present a high impedance to the video signal at the input 105. The operational amplifier 200 may generate a high gain. The operational amplifier 200 may generate a high gain allowing the video signal to be duplicated at the negative terminal of the operational amplifier 200. The operational amplifier 200, the transistor 206 and the current source 208 are generally connected in a negative feedback loop. If the operational amplifier 200 provides sufficient gain, and the negative feedback loop is designed to be stable, the negative feedback loop will normally minimize the error voltage (e.g., the voltage between the positive terminal and the negative terminal of the operational amplifier 200). The voltage at the negative terminal will normally track the voltage at the positive terminal.

The negative terminal of the operational amplifier 200 may be connected to the DC current source 208, the replica resistor 207 and the source of the transistor 206. The output of the operational amplifier 200 may be coupled to a gate of the transistor 206. A drain of the transistor 206 may be coupled to a gate and drain of the transistor 202. A gate of the transistor 202 may be coupled to a gate of the transistor 204. A drain of the transistor 204 may be coupled to a first side of the current supply 210. The drain of the transistor 204 may also be coupled to the input 105.

The DC current source 208 may be implemented to bias the transistor 206 under various operating conditions. In order for the feedback loop to function properly, the transistor 206 should normally carry some minimum amount of current. For example, when VIN>VOP, controlling the current carried by the transistor 206 is not an issue since the current across the resistor 207 (e.g., (VIN−VOP)/RIN) will flow out of the source of the transistor 206. However, when VIN<VOP, current does not normally flow into the source of the transistor 206 (an N-type device). If the current IDC is a DC current, then the current flowing out of the source of the transistor 206 may be defined as IDC−(VOP−VIN)/RIN. If the current IDC is chosen large enough, current will continue to flow out of the source of the transistor 206, thus continuing to bias the transistor 206 properly. Therefore, when VIN>VOP, current out of the source of the transistor 206 may be defined as IDC+(VIN−VOP)/RIN, which is normally always positive. When VIN<VOP, current out of the source of the transistor 206 may be defined as IDC−(VOP−VIN)/RIN, which is normally positive if the current IDC is large enough. In one example, the current IDC may be chosen to be greater than (VOP−VINmax)/RIN, where VINmax is the largest expected input signal.

The transistor 206 normally contains an offset current IDC in addition to a replica of the input current. The current source 210 and the current mirror formed by the transistor 202 and the transistor 204 effectively allow for electronically subtracting the offset current IDC to allow the replica of input current (e.g., current across the resistor 128) to be generated. The drain of the transistor 204 normally connects to the current source 210, forming another branch connected to the input 105. The branch that connects to the input 105 conducts the difference of the current in the transistor 204 and the current source 210. The current from the cancellation circuit 124 into the input 105 may be defined as (VIN−VOP)/RIN. When VIN<VOP, the cancellation circuit 124 provides a quantity that will be negative, meaning the current will flow from the input node 105 into the cancellation circuit 124.

The replica resistor 207 is normally terminated (or coupled) with the same voltage (e.g., VOP) as that of the negative terminal of the operational amplifier 120 in the inverting circuit. The input current (e.g., IIN) that flows through the replica resistor 207 is normally the same current that flows through the input resistor 128. The current sources 208 and 210 carry substantially similar currents (e.g., IDC) to each other. The current IDC may be fixed. The input current IIN may be time varying. The current IDC may be selected to be large enough to cover the largest possible current drawn by the input resistor 128 (and the replica resistor 207). For example, it may be necessary for the current IDC to be greater than the maximum of the current IIN. The current IIN may be the input current to the video receiver 104 or the current passed through the input resistor 128. The transistors 202 and 204 may form a current mirror circuit.

When the video input signal (e.g., VIN) is larger than the voltage VOP, the input current IIN may be defined as (VIN−VOP)/RIN that flows into the video receiver 104. The input current IIN also flows through the replica resistor 207 and into the termination voltage VOP. The transistor 206 and the current mirror circuit (e.g., the transistors 202 and 204) may carry a total current given by IDC+(VIN−VOP)/RIN (or the current IIN). Since the current source 210 carries the current IDC, a net current of (VIN−VOP)/RIN flows out of the active current cancellation circuit 124 and effectively cancels the input current IIN into the input resistor 128. A similar analysis generally holds when the voltage VIN<VOP. Under ideal circumstances, the net current into or out of the video receiver 104 is zero. Mismatch and offset effects may limit the cancellation achieved by the circuit 100. In an integrated circuit (IC) environment, excellent matching and offset may be obtained with proper layout and component sizing. For example, in certain IC processes, over 95% cancellation may be obtained. The particular amount of cancellation provided may vary in response to the particular fabrication process used.

The system 100 may actively cancel the input current of the video receiver 104 due to the finite input resistance (or the resistance of the resistor 128). The replica resistor 207 may act as a negative resistor with a resistance of −RIN, where RIN is the input resistance of the video receiver 104 and the value of the input resistor 128. The implementation of the replica resistor 207 (to provide active current cancellation) may be useful for a number of implementations outside of video clamping applications. The present invention may also be implemented in instrumentation amplifiers. Instrumentation amplifiers are generally designed to have high input impedance and used in a non-inverting configuration. The high input impedance is preferred so as not to disturb the voltage being measured. As discussed, non-inverting topologies are normally more difficult to design with high linearity. An inverting instrumentation amplifier, coupled with the active cancellation circuit 124, may be an attractive solution for implementing both high linearity and an effective high input impedance.

The present invention may actively cancel the input current of a video receiver. Such a cancellation may allow the use of highly linear and high bandwith operational amplifier topologies at the input 105 of the video receiver 104 that may achieve a quiet and low current clamp circuit design. With the present invention, the particular degree of linearity and bandwidth of the operational amplifier 200 may not be critical. For example, with the linearity and bandwidth of the operational amplifier 200 may not be critical since the circuit 100 implements a duplication and cancellation of the input current. The current cancellation circuit 124 may need to duplicate the average current flowing into the input resistor 128. The instantaneous cancellation of the input current is not necessary because of the very slow nature of the drift voltage. The present invention may allow a relaxation in design standards since the current cancellation circuit 124 is not in the path of the video input signal.

Figure 3:
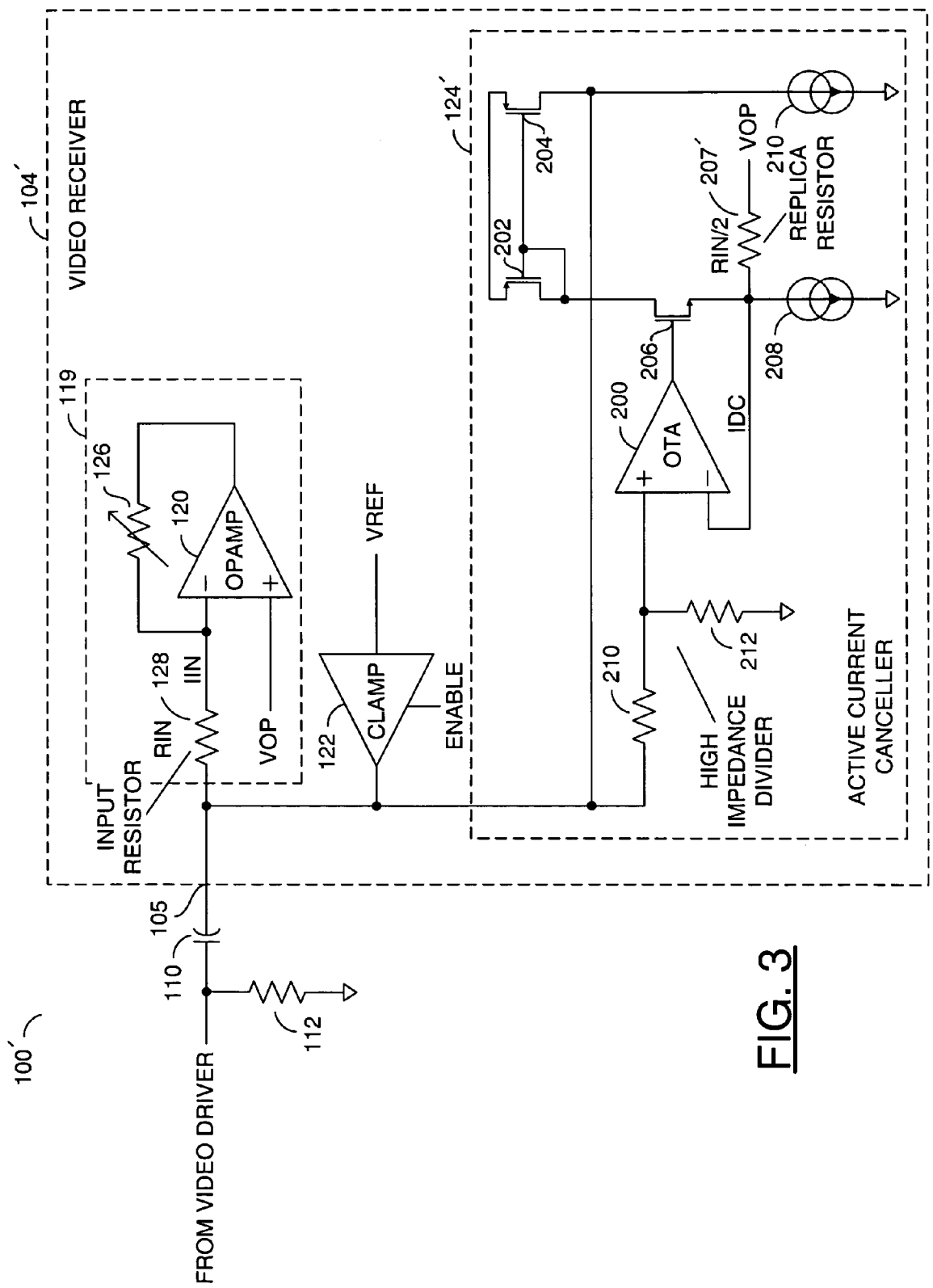
FIG. 3 is an alternate embodiment of the present invention.

Referring to FIG. 3, an alternate embodiment of a system 100' is shown. The video receiver 104' generally comprises the inverting circuit 119 and the active current cancellation circuit 124'. The current cancellation circuit 124' generally comprises the operational amplifier 200, the transistor 202, the transistor 204, the transistor 206, a replica resistor 207', the current source 208, the current source 210, a resistor 210, and a resistor 212. The resistors 210 and 212 may form a high impedance divider. A first end of the resistor 210 and the resistor 212 may be coupled to the positive terminal of the operational amplifier 200. The replica resistor 207' may be implemented with half of the resistance of the input resistor 128. The resistance of the replica resistor 207' may be varied to meet the design criteria of a particular implementation.

The current cancellation circuit 124' may be implemented in cases where the available power supply is not large enough for amplitudes of the input signal that the video receiver 104 may need to handle. The input voltage (e.g., the input voltage to the active current cancellation circuit 124') may be divided into two or more voltages (e.g., a first voltage across the resistor 210 or a second voltage across the resistor 212) via the high impedance resistor divider (e.g., the resistors 210 and 212). The first voltage or the second voltage may be a predetermined voltage level as selected by the designer. Generally, the resistance value of the replica resistor 207 is proportional to the resistance value of the input resistor 128. The particular resistance value of the replica resistor 207' may depend on how much the input voltage is divided down by the high impedance resistor divider. For example, if the input voltage is divided in half by the high impedance resistor divider, the resistance value of the replica resistor 207' may be divided in half. The resistance value of the replica resistor 207' may be selected to ensure that the input resistor 128 and the replica resistor 207' draw approximately the same current (or the current IIN) to each other. The possible signal filtering in the high impedance divider may not be an issue since only an average current signal needs to be duplicated by the current cancellation circuit 124'. As discussed in connection with FIG. 2, an operational amplifier with modest linearity/bandwith may be sufficient to provide canceling of the input current presented to the video receiver 104.

The system 100' may be implemented in applications where the input voltage (e.g., voltage to the active current cancellation circuit 124') is large or the available power supply is low. In order to operate linearly, the transistors of the system 100' may need a certain voltage headroom. Headroom becomes more of an issue as the power supply voltage to signal amplitude gets smaller (e.g., as the power supply voltages get smaller or as the signals get larger). The nodes of the operational amplifier 200 are sensitive to headroom parameters since the nodes track the input voltage. An input voltage that is too high or too low may violate the headroom parameters of P-type and/or the N-type transistors. By dividing the input voltage down before the input voltage reaches the positive input of operational amplifier 200, the system 100' may effectively operate at low supplies. The specific headroom parameters may vary depending on the particular topology of the amplifier 200, the amplitude of the input voltage, the available power supply value, etc.

Figure 4:
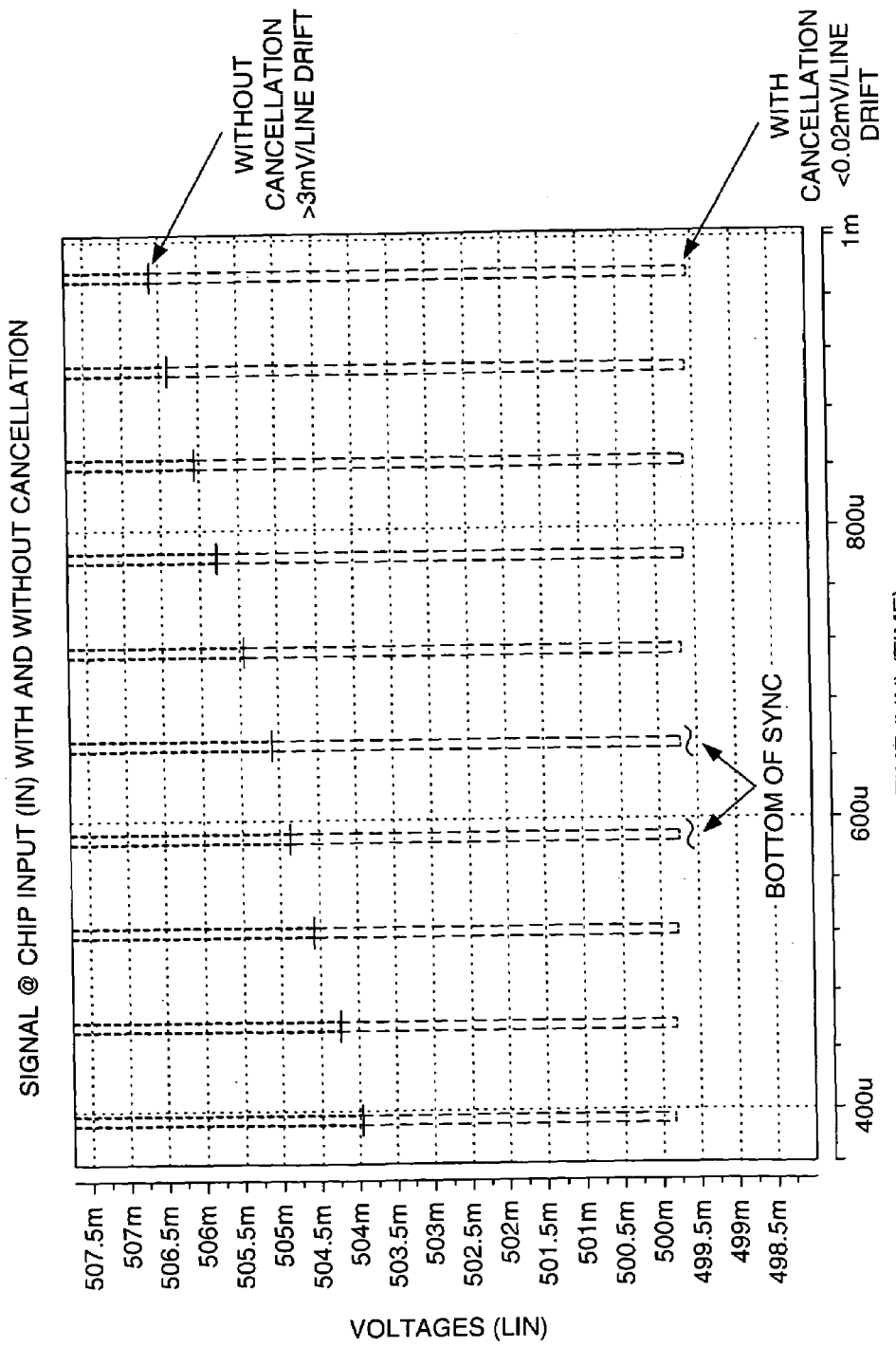
FIG. 4 is a plot of voltage versus time.

FIG. 4 illustrates voltage over time and compares voltage drift between systems with and without the current cancellation circuit 124. FIG. 4 illustrates a voltage drift greater than 3 mV per video line for a system not implemented with the current cancellation circuit 124. A voltage drift of less than 0.02 mV per video line is shown for the system 100 with the current cancellation circuit 124. For synchronization, automatic gain control, timing recovery and/or other implementations, video signals may contain special pulses illustrated as sync pulses. For example, in standard NTSC video, the active portion of video may occupy from 0 to 714 mV. A horizontal sync pulse may occupy from 0 to −286 mV. The sync pulse may last 4.7 us of a 65 us video line. The sync pulse is normally independent of the video content and may provide one portion of a video signal that may be monitored to analyze line to line variations in the video. The voltage levels in the active portion of video will change as the video content changes. In a well-designed video receiver, the bottom of sync (e.g., the most negative voltage level of the sync pulse) should exhibit minimal line to line variation. The bottom of sync (often called sync tip) is normally not the only content independent portion of the video signal. Additionally, monitoring the "back porch" or "front porch" portion of the video signal may also be implemented. FIG. 4 is shown zoomed to the bottom (or tip) of the sync pulses to illustrate how such pulses change over time. In one example of FIG. 4, the sync pulses last about 4.7 us and arrive every 65 us. However, other intervals may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   a first circuit configured to generate a video input signal having a voltage;
   a second circuit having a finite input resistance configured to generate a first current in response to applying said voltage across said finite input resistance, and
   a third circuit to (a) receive said voltage and (b) cancel said current by generating a second current having a negative value when compared with said first current, wherein said second current is generated in response to applying said voltage across a replica resistor having a resistance similar to said finite input resistance.

2. The apparatus according to claim 1, wherein said third circuit further comprises:
   a first operational amplifier to (i) duplicate said voltage generated in said first circuit and (ii) present said voltage to said replica resistor; and
   one or more current sources configured to pass said current away from said apparatus.

3. The apparatus according to claim 2, wherein said third circuit further comprises a first transistor, a second transistor and a third transistor, wherein said second transistor and said third transistor form a current mirror circuit.

4. The apparatus according to claim 3, wherein (i) said first transistor is an N-type transistor, (ii) said second transistor is a P-type transistor and (iii) said third transistor is a P-type transistor.

5. The apparatus according to claim 2, wherein said one or more current sources include a first current source and a second current source.

6. The apparatus according to claim 1, wherein said first circuit further comprises a second operational amplifier, a first resistor and a second resistor.

7. The apparatus according to claim 6, wherein said operational amplifier, said first resistor and said second resistor are implemented as an inverted operational amplifier circuit to provide linear and high bandwidth properties for said apparatus.

8. The apparatus according to claim 6, where said second resistor is a variable resistor.

9. The apparatus according to claim 1, further comprising:
   a clamp circuit to restore a DC level of a portion of said video input signal to a predetermined value.

10. The apparatus according to claim 1, wherein said apparatus is implemented in a system selected from the group consisting of video clamps and instrumentation amplifiers.

11. An apparatus comprising:
    a first circuit configured to generate a video input signal having a voltage;
    a second circuit having a finite input resistance configured to generate a first current in response to applying said voltage across said finite input resistance, and
    a third circuit to (i) divide said voltage into a predetermined voltage level with a high impedance divider and (ii) cancel said current by generating a second current having a negative value when compared to said first current, in response to applying said predetermined voltage level across a replica resistor.

12. The apparatus according to claim 11, wherein said high impedance divider comprises one or more resistors.

13. The apparatus according to claim 12, wherein said third circuit further comprises a first operational amplifier coupled to said one or more resistors.

14. The apparatus according to claim 12, wherein said replica resistor includes a resistance which is proportional to said finite input resistance.

15. The apparatus according to claim 13, wherein said third circuit further comprises a first transistor, a second transistor and a third transistor, wherein said second transistor and said third transistor form a current mirror circuit.

16. The apparatus according to claim 15, wherein (i) said first transistor is an N-type transistor, (ii) said second transistor is a P-type transistor and (iii) said third transistor is a P-type transistor.

17. The apparatus according to claim 11, wherein said third circuit comprises one or more current sources configured to pass said current away from said apparatus.

18. The apparatus according to claim 11, wherein said first circuit further comprises a second operational amplifier, a first resistor and a second resistor.

19. The apparatus according to claim 18, wherein said second operational amplifier, said first resistor and said second resistor are implemented as an inverted operational amplifier circuit to provide linear and high bandwidth properties for said apparatus.

20. A method for actively canceling a current for high performance video clamps:
    (A) generating a video input signal having a voltage;
    (B) providing a finite input resistance to generate a first current in response to presenting said voltage across said finite input resistance;
    (C) generating a second current having a negative value when compared with said first current in response to presenting said voltage across a replica resistor having a resistance similar to said finite input resistance; and
    (D) canceling said current in response to performing steps (A)-(C).

* * * * *